United States Patent [19]

Vora

[11] 4,032,372

[45] * June 28, 1977

[54] EPITAXIAL OUTDIFFUSION TECHNIQUE FOR INTEGRATED BIPOLAR AND FIELD EFFECT TRANSISTORS

[75] Inventors: Madhukar B. Vora, Beacon, N.Y.

[73] Assignee: International Business Machines Corporation, Armonk, N.Y.

[ * ] Notice: The portion of the term of this patent subsequent to Mar. 27, 1990, has been disclaimed.

[22] Filed: Sept. 10, 1975

[21] Appl. No.: 612,140

Related U.S. Application Data

[63] Continuation of Ser. No. 138,161, April 28, 1971, abandoned.

[52] U.S. Cl. .................................. 148/175; 29/571; 29/576 E; 29/577; 148/187; 148/191; 357/42; 357/44; 357/48; 357/90

[51] Int. Cl.² ............... H01L 21/225; H01L 21/20; H01L 21/76

[58] Field of Search ............... 148/175, 187, 191; 357/42, 44, 48, 90; 29/571, 576, 577

[56] References Cited

UNITED STATES PATENTS

| 3,244,950 | 4/1966 | Ferguson | 148/175 X |
| 3,440,503 | 4/1969 | Gallagher et al. | 148/175 X |
| 3,481,801 | 12/1969 | Hugle | 148/175 |
| 3,609,479 | 9/1971 | Lin et al. | 357/48 X |
| 3,723,199 | 3/1973 | Vora | 148/175 |
| 3,748,545 | 7/1973 | Beale | 357/48 X |

FOREIGN PATENTS OR APPLICATIONS 1,237,712  6/1971  United Kingdom ............... 148/175

Primary Examiner—L. Dewayne Rutledge
Assistant Examiner—W. G. Saba
Attorney, Agent, or Firm—Robert J. Haase

[57] ABSTRACT

An NPN transistor, a P channel and an N channel field effect transistor are formed in the same epitaxial layer on a monolithic semiconductor substrate. Subcollector-like areas of one conductivity type are diffused into selected regions of a semiconductor substrate of the opposite conductivity type. Each subcollector-like area comprises two impurities of the same conductivity type but different concentrations and diffusion rates. An epitaxial layer of the same conductivity type as the substrate is grown over the substrate. One of each pair of subcollector impurities outdiffuses completely through the epitaxial layer during the growth of the epitaxial layer and during subsequent heat treatments to define a plurality of isolated pockets of a conductivity type opposite the conductivity type of the surrounding epitaxial layer and substrate. An NPN bipolar transistor and a P channel field effect transistor subsequently are formed in respective isolated pockets. An N channel field effect transistor is formed in the epitaxial layer between the isolated pockets.

7 Claims, 8 Drawing Figures

EPITAXIAL OUTDIFFUSION TECHNIQUE FOR INTEGRATED BIPOLAR AND FIELD EFFECT TRANSISTORS

This is a continuation of application Ser. No. 138,161 filed Apr. 28, 1971 now abandoned,

BACKGROUND OF THE INVENTION

The desirability of forming bipolar and field effect transistors on the same monolithic semiconductor substrate is well known. Many proposals have been made in the prior art for accomplishing that purpose. Generally, the previously proposed techniques involved either comprising optimized processes (for making the bipolar and field effect transistors separately) in an effort to maintain desirable device performance characteristics (of either or both types of transistors) in an effort to maintain a simplified process. One of the major obstacles standing in the way of prior art success is the fact that the impurity concentration levels associated with bipolar transistor substrates are an order of magnitude different from those associated with field effect transistors. Accordingly, there is a need for a technique for the fabrication of bipolar and field effect transistors on the same monolithic substrate permitting substantially independent impurity concentration control while using process steps previously optimized for the fabrication of bipolar and field effect transistors when made separately.

SUMMARY OF THE INVNETION

Substantially independent impurity concentration control is achieved in a preferred epitaxial layer embodiment by setting the epitaxial layer background resistivity value for optimized N channel FET purposes and by using a double impurity outdiffusion technique to obtain introduced resistivity values for optimized P channel and NPN bipolar transistor purposes. Said outdiffusion techniques creates self-isolated regions in the epitaxial layer characterized by an impurity gradient which varies from a relatively low value at the surface of the epitaxial layer to a relatively high value below the surface of the isolated region. The vertical resistivity profile of the epitaxial layer within an isolated region can be tailored for optimized P channel FET and bipolar transistor purposes, respectively, by appropriate choice of the initial concentrations of two impurities that together produce the outdiffused self-isolated regions in which the P channel FET and bipolar transistors are formed.

In a preferred embodiment, two dopants of one conductivity type are placed in selected regions of a substrate of the opposite conductivity type. The two dopants are characterized by substantially different diffusion rates and by different initial concentrations, the dopant of lower diffusion rates having the higher concentration. An epitaxial layer of said opposite conductivity type is deposited on the substrate and the two dopants are outdiffused through the epitaxial layer until the faster diffusing dopant reaches the upper surface of the epitaxial layer. In this manner, a self-isolated pocket of one conductivity type is formed at each of the desired locations in the epitaxial layer. Epitaxial layer resistivity at the surface within each isolated region and at the surface between adjacent isolated regions is of the order of $10^{16}$ atoms per cubic centimeter which is optimum for the formation of P channel and N channel FETs. By virtue of the impurity gradient resulting from the double outdiffusion technique by which each isolated region is formed, the impurity concentration within each isolated pocket at the depth at which the collector of a bipolar transistor is formed is of the order of $10^{17}$ atoms per cubic centimeter for optimized bipolar transistor purposes.

Simultaneous diffusions are made in each isolated region in which the P base and P source and drain regions of an NPN transistor and P channel FET are desired. Subsequent simultaneous diffusions are made to form the N emitter of each desired NPN transistor and the N source and drain regions of each desired N channel FET, said N source and drain diffusions being made in the epitaxial layer between adjacent self-isolated regions. Additional and conventional processing steps complete the bipolar and FET devices.

DESCRIPTION OF THE PREFERRED EMBODIMENTS

Figure 1:
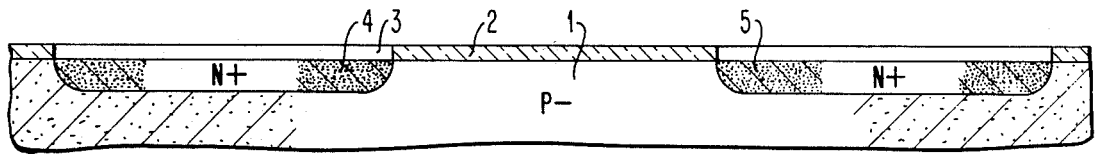
FIGS. 1–6 represent simplified cross-sectional views of the integrated bipolar and field effect transistor structure corresponding to respective steps in the method of the present invention.
Figure 7:
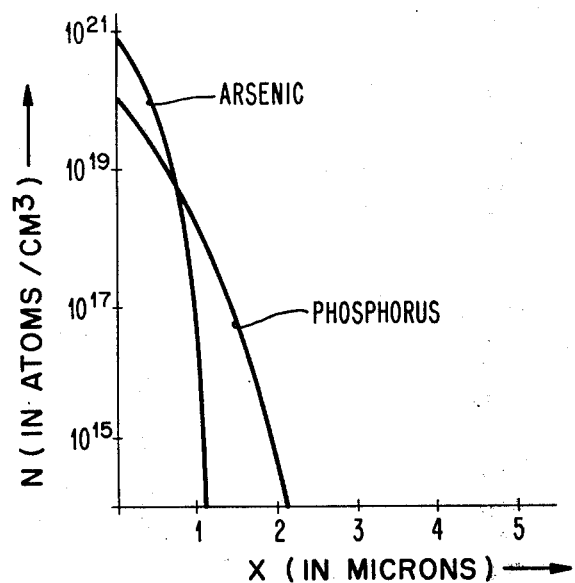
FIG. 7 is a plot of the N+ impurity profile in the substrate represented by FIG. 1.

Referring to FIG. 1, a [100]p– silicon substrate 1 (impurity concentration no greater than about $10^{15}$ atoms per cubic centimeter) having a surface resistivity of about 10 to 20 ohm-cm is initially oxidized with a layer of silicon dioxide 2. A window 3 is etched in oxide 2 by conventional photoresist techniques (not shown). A subcollector-like area 4 is diffused through window 3 into substrate 1 at each substrate location at which a self-isolated pocket is to be established later. Two such subcollector-like areas 4 and 5 are shown by way of example. Each of the areas 4 and 5 comprise two dopants (for example arsenic and phosphorus) having different diffusion rates and concentrations and both being of a conductivity type opposite that of the P– substrate 1. Representative impurity profiles are depicted in FIG. 7 for the arsenic and phosphorus in substrate 1 at this point in the process. In the exemplary embodiment of the present invention, areas 4 and 5 are formed by capsule diffusion at 1100° C for 60 minutes. The diffusion yields a sheet resistivity of 7.0 ohms/ □ and a junction depth of 0.045 mil using a source powder which is a mixture of 1.5 grams of 2% arsenic doped silicon and 1.5 grams of $10^{19}$ atom/cc phosphorus doped silicon. The source powder is prepared immediately prior to the sealing of the capsule from separately stored arsenic doped silicon and phophorus doped silicon areas.

Figure 2:
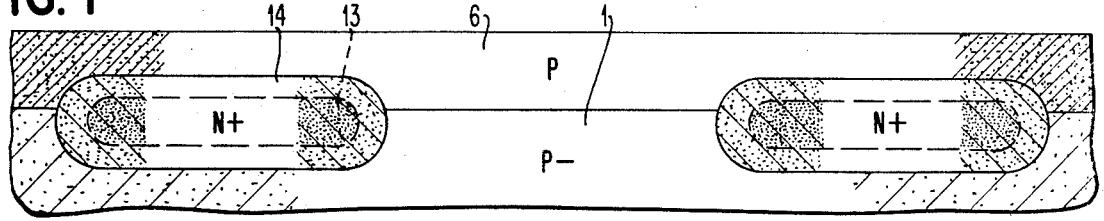
Figure 3:
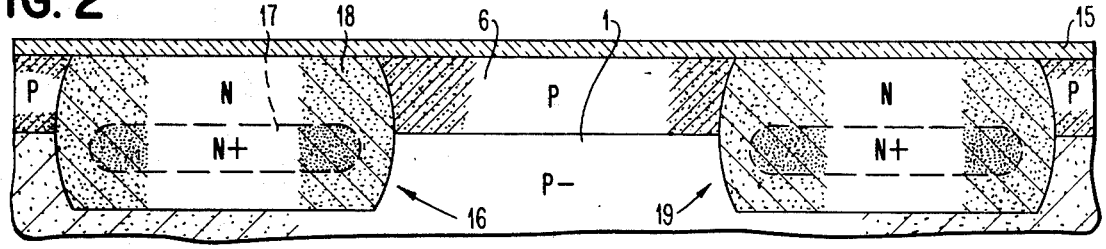

Next, the oxide coating 2 is stripped from the substrate and 3 micron thick, 2.0 ohm/cm P epitaxial layer 6 is grown as shown in FIG. 2. It will be noted that both the arsenic and phosphorus have outdiffused somewhat into epitaxial layer 6 at the completion of the epitaxial deposition step shown in FIG. 2. The slower diffusing arsenic is represented by dashed boundary line 13 whereas the faster diffusing phosphorus is represented by the solid boundary line 14. Oxide layer 15 of FIG. 3 then is formed on the top surface of epitaxial layer 6 and the arsenic and phosphorus impurities are outdiffused until the phosphorus reaches fully through epitaxial layer 6 to the top surface thereof. At this point, isolated pockets 16 and 19 of M conductivity type material are formed within P epitaxial layer 6 on P-substrate 1. Exemplary isolated pocket 16 is characterized by a region 17 of relatively heavily doped N+ type conductivity material (impurity concentration of about $10^{20}$ atoms/cc) comprising arsenic and phosphorus and a region 18 having a retrograded relatively lower N type impurity concentration (from about $10^{18}$ atoms/cc adjacent region 17 to about $10^{16}$ atoms at the surface) comprising out-diffused phosphorus. The process described up to this point corresponds to that of co-pending patent application Ser. No. 875,012 filed Nov. 10, 1969 in the name of Madhukar B. Vora and assigned to the present assignee. As taught in said application, various semiconductor circuit elements can be formed within respective isolated pockets such as pockets 16 and 19. For example, a bipolar transistor can be formed by making successive base and emitter diffusions in an isolated pocket.

Figure 8:
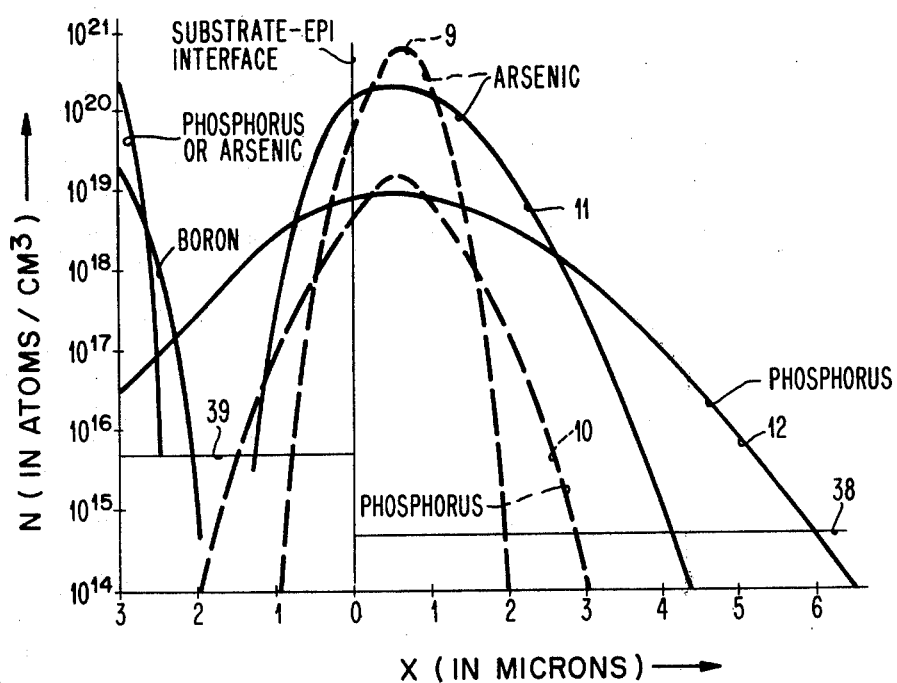
FIG. 8 is a plot of the impurity profile of an NPN transistor formed in a self-isolated pocket in accordance with the present invention.

The present invention is an extension of the teachings of the aforesaid co-pending application specifically directed to the formation of integrated bipolar and field effect transistors formed within and between the isolated pockets. In the disclosed exemplary embodiment wherein isolated pockets of N type impurity are formed in a P epitaxial layer on a P− substrated, an NPN bipolar transistor and a P channel field effect transistor are formed within respective isolated pockets and an N channel field effect transistor is formed in the epitaxial layer between the isolated pocket. The resulting integrated structure uniquely exploits the fact that each isolated pocket is produced by out-diffusion of dopants upwards from the epitaxial layer-substrate interface. Said out-diffusion produces a self-isolated pocket characterized by a retrograded impurity profile which varies from a relatively lightly doped (N+) bottom region toward a relatively lightly doped (N) upper region. The bottom layer impurity concentration provides optimized subcollector and collector regions for an NPN bipolar transistor whereas the upper region impurity concentration is orders of magnitude less for optimized field effect transistor fabrication. Typical impurity profiles of the arsenic and phosphorus as well as the background dopant concentrations in each self-isolated pocket are shown in FIG. 8. Dotted curves 9 and 10 represent the arsenic and phosphorus profiles, respectively, when out-diffusion is still incomplete whereas lines 11 and 12 represent final profiles. Lines 38 and 39 represent the P− substrate doping and the P epitaxial layer doping, respectively.

Figure 4:
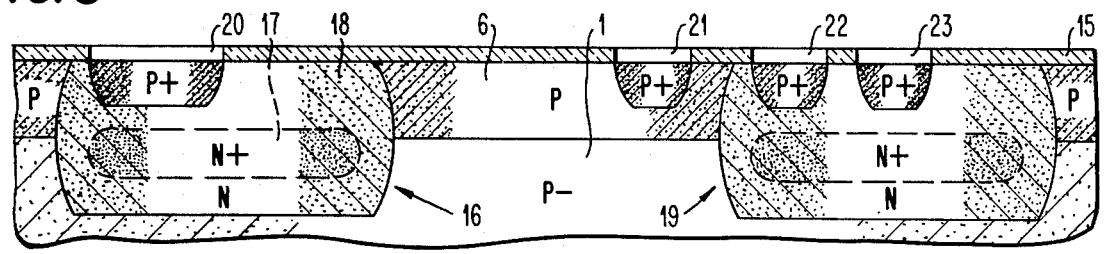
Figure 5:
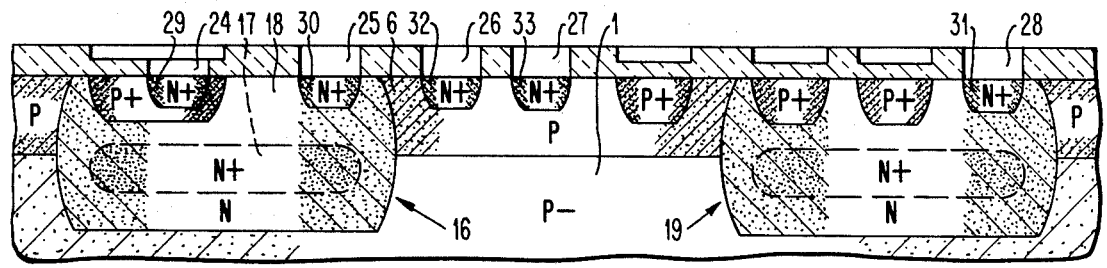
Figure 6:
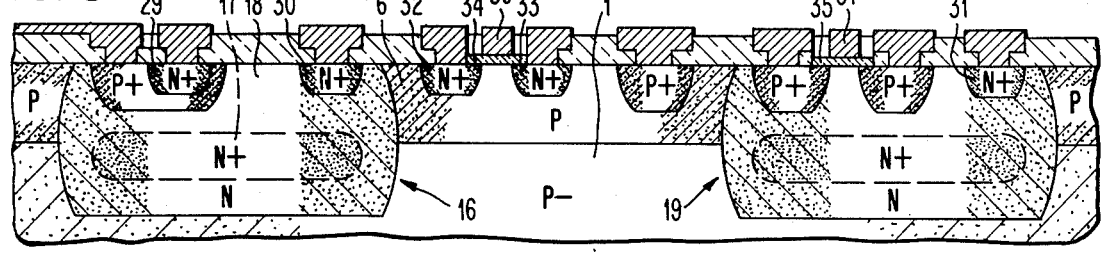

An NPN bipolar transistor is formed in isolated region 16, a P channel field effect transistor is formed in isolated region 19 and an N channel field effect transistor is formed in the epitaxial layer 6 between pockets 16 and 19 as shown in FIGS. 4, 5 and 6. One of the important features of the present invention which maintains process simplicity without compromising desired device performance characteristics is the manner in which the bipolar transistor base and emitter and the field effect transistor source and drain regions are formed. Using standard diffusion or ion implantation techniques, say a vapor phase diffusion technique, the P channel source and drain are diffused simultaneously with the base diffusion of the NPN transistor. The N channel source and drain are formed simultaneously with the emitter diffusion of the NPN transistor. Accordingly, diffusion windows 20, 21, 22 and 23 are opened in oxide layer 15 of FIG. 4 to allow a simultaneous P+ diffusion for the formation of a bipolar transistor base region for the substrate contact of the N channel FET, and for the source and drain regions of the P channel FET, respectively. Boron is a suitable impurity for making these simultaneous diffusions. In the exemplary embodiment, a capsule diffusion using a boron source of impurity concentration $7.5 \times 10^{19}$ atoms/cc, temperature of 1,000° C and difffusion time of 60 minutes produces a sheet resistivity of 169 ohms/ □ and a base junction depth of 0.024 mils.

The p+ diffusion is followed by an oxidation cycle (not shown) at 907° C using oxygen, steam and oxygen for 5, 45 and 5 minutes, respectively, to provide an oxide thickness of 2800A. The sheet resistivity of the preceding boron diffusion is increased to 449 ohms/ □ and the base junction depth is increased to 0.026 mils as a result of the oxidation cycle. Photoresist next is applied in a conventional manner to delineate the emitter and collector contact region of the bipolar transistor, the source and drain regions of the N channel field effect transistor and the substrate contact of the P channel field effect transistor. Accordingly, diffusion windows 24, 25, 26, 27 and 28 of FIG. 5 are opened for an N+ diffusion which simultaneously forms the emitter 29 and collector contact 30 of the NPN bipolar transistor in isolated pocket 16, the substrate contact 31 for the P channel field effect transistor formed in isolated pocket 19 and the source and drain 32 and 33 of the N channel field effect transistor formed in the epitaxial layer 6 between isolated pockets 16 and 19.

In the exemplary embodiment, the simultaneous N+ diffusions preferably are made using a capsule diffusion with 1.55% arsenic doped silicon at a temperature of 1,000° C for 60 minutes. This procedure a sheet resistivity of 20 ohms/ □ and a junction depth of 0.011 mils in the N+ diffusion areas. A drive-in cycle at 970° C using oxygen, steam and oxygen for 5, 20 and 5 minutes, respectively, produces an oxide thickness of 3,000A and increases the sheet resistivity to 30 ohms/ □ and the junction depth to 0.014 mils in the N+ diffusion areas.

The N channel and the P channel field effect transistor structures are completed in a conventional manner. Briefly, the oxide is removed in the N channel and P channel active areas and is regrown to a desired thickness. The regrown oxide is charge-stabilized, for example, by the application of a layer of phosphosilicate glass followed by an annealing cycle. Lastly, the field effect transistor gate and the necessary contact metallurgy is formed to yield the final device shown in FIG. 6. The reference numerals 34 and 35 designate the regrown gate oxide for the N channel and P channel field effect transistors, respectively. Reference numerals 36 and 37 designate the gate electrode for the N channel and P channel field effect transistors, respectively.

As described in the preceding exemplary embodiment of the present invention, arsenic diffusion is used to form the emitter of the bipolar transistor and the source and drain of the N channel field effect transistor. Arsenic is preferred over other N conductivity type impurities such as phosphorus because an arsenic emitter increases the high frequency performance of an NPN bipolar transistor. In addition, arsenic diffuses through a much shorter distance than phosphorus (to establish a given resistivity in the substrate) allowing the source and drain diffusion windows to be brought closer together for a given effective field effect transistor channel length. This reduction in dimension facilitates a substantial increase in component density at the chip level. Moreover, the use of arsenic (rather than phosphorus, for example) as the N+ dopant for the simultaneous source, drain and emitter diffusion makes it possible for the bipolar transistor properties to remain substantially uneffected during the subsequent three high temperature cycles required to complete the field effect transistor structure, namely, the gate oxide regrowth cycle at 970° C, the phosphosilicate glass deposition at 900° C and the annealing cycle at 1,050° C. It would be extremely difficult to control the base width of a bipolar transistor if phosphorus were used for making the source, drain and emitter. Arsenic, being a slower diffusing dopant, yields better base width control.

It should be noted that the fabrication parameters including the impurity profiles discussed in the foregoing specification are exemplary only. In general, the background doping levels of the substrate and of the epitaxial layer and the initial concentration of the dopant (arsenic and phosphorus, for example) in the substrate and the junction depth, etc. may be varied in accordance with established design considerations determined by the nature of the semiconductor devices which are to be formed in respective isolated N pockets. With regard to the initial concentration of the arsenic introduced into the substrate, it has been observed that high concentration in excess of about $10^{21}$ atoms/cc give rise to a lateral spreading of the arsenic along the interface between the epitaxial layer and the substrate during the time that the epitaxial layer is being grown. Such spreading is undesirable inasmuch as it tends to increase the design distance between adjacent isolated N pockets and, in the worst case, might even reach between and thereby short circuit adjacent N pockets together. This problem can be avoided in a number of ways some of which are outlined in "Silicon Semiconductor Technology" W. R. Runyan, McGraw-Hill, 1965, p. 70. Perhaps the simplest method is to reduce the value of the initial arsenic surface concentration below $10^{21}$ atoms/cc. It is also advantageous to introduce an initial burst of extra P dopant when initiating the growth of the P doped epitaxial layer to compensate for any N+ autodoping from the subcollector-like areas previously placed in the substrate.

While this invention has been particularly described with reference to the preferred embodiments thereof, it will be understood by those skilled in the art that the foregoing and other changes in form and details may be made therein without departing from the spirit and scope of the invention.

What is claimed is:

1. A method for making monolithic semiconductor devices comprising the steps of:
   Providing a semiconductor substrate of one conductivity type,
   introducing two impurities of different diffusion rates and of the other conductivity type into said substrate through each of a plurality of desired surface locations,
   the concentration of the impurity having the lower diffusion rate being greater than the concentration of the impurity having the higher diffusion rate,
   forming an epitaxial layer of semiconductor material on said substrate and over said locations, said epitaxial layer being of the same conductivity type as said substrate,
   heating said epitaxial layer and said substrate to outdiffuse said higher diffusion rate impurity completely through said epitaxial layer to reach the surface of said epitaxial layer opposite the interface between said epitaxial layer and said substrate,
   forming at one of said desired surface locations a bipolar transistor wholly within the region of said epitaxial layer through which said higher diffusion rate impurity has outdiffused completely through said expitaxial layer to reach said surface of said epitaxial layer opposite said interface,
   said higher diffusion rate impurity forming the collector of said bipolar transistor and the other of said impurities forming the subcollector of said bipolar transistor, and
   forming an insulated gate field effect transistor in said epitaxial layer outside said region.

2. The method defined in claim 1 wherein said field effect transistor is formed in said epitaxial layer between said desired locations.

3. The method defined in claim 1 wherein said introducing step is a diffusion step.

4. The method defined in claim 3 wherein said impurities are arsenic and phosphorus.

5. A method of making monolithic semiconductor devices comprising the steps of:
   providing a semiconductor substrate of one conductivity type,
   introducing two impurities of different diffusion rates and of the other conductivity type into said substrate through each of a plurality of desired surface locations,
   the concentration of the impurity of having the lower diffusion rate being greater than the concentration of the impurity having the higher diffusion rate,
   forming an epitaxial layer of semiconductor material on said substrate and over said locations, said epitaxial layer being of the same conductivity type as said substrate,
   heating said epitaxial layer and said substrate to outdiffuse said higher diffusion rate impurity completely through said epitaxial layer to reach the surface of said epitaxial layer opposite the interface between said epitaxial layer and said substrate,
   forming at respective ones of said desired locations a bipolar transistor and an insulated gate field effect transistor wholly within the region of said epitaxial layer through which said higher diffusion rate impurity has outdiffused completely through said epitaxial layer to reach said surface of said epitaxial layer opposite said interface,
   said higher diffusion rate impurity forming the collector of said bipolar transistor and the other of said impurities forming the subcollector of said bipolar transistor, and
   forming another insulated gate field effect transistor in said epitaxial between said desired locations.

6. The method defined in claim 5 wherein said bipolar transistor and said field effect transistors are formed by diffusion,
   the base of said bipolar transistor and the source and drain of one of said field effect transistors being diffused simultaneously, and
   the emitter of said bipolar transistor and the source and drain of another of said field effect transistors being diffused simultaneously.

7. The method defined in claim 6 wherein arsenic is used for the diffusion of said emitter.

* * * * *